United States Patent
Hoang Co Thuy et al.

(10) Patent No.: US 9,048,799 B2
(45) Date of Patent: Jun. 2, 2015

(54) METHOD FOR ENHANCING LOW FREQUENCIES IN A DIGITAL AUDIO SIGNAL

(75) Inventors: Vu Hoang Co Thuy, Paris (FR); Benoit Pochon, Paris (FR)

(73) Assignee: PARROT, Paris (FR)

( * ) Notice: Subject to any disclaimer, the term of this patent is extended or adjusted under 35 U.S.C. 154(b) by 373 days.

(21) Appl. No.: 13/597,193

(22) Filed: Aug. 28, 2012

(65) Prior Publication Data

US 2013/0230191 A1  Sep. 5, 2013

(30) Foreign Application Priority Data

Sep. 13, 2011 (FR) ..................... 11 58164

(51) Int. Cl.
*H03G 3/00* (2006.01)
*H04R 3/08* (2006.01)
*H04R 3/00* (2006.01)

(52) U.S. Cl.
CPC ............... *H03G 3/007* (2013.01); *H04R 3/007* (2013.01); *H04R 3/08* (2013.01)

(58) Field of Classification Search
CPC combination set(s) only.
See application file for complete search history.

(56) References Cited

U.S. PATENT DOCUMENTS

| | | | |
|---|---|---|---|
| 4,327,250 A | 4/1982 | von Recklinghausen | |
| 6,201,873 B1 | 3/2001 | Dal Farra | |
| 8,462,963 B2 * | 6/2013 | Bongiovi et al. | 381/98 |
| 2005/0207584 A1 | 9/2005 | Bright | |
| 2005/0271216 A1 * | 12/2005 | Lashkari | 381/59 |
| 2007/0258603 A1 * | 11/2007 | Avendano et al. | 381/106 |
| 2008/0175397 A1 * | 7/2008 | Holman | 381/55 |
| 2008/0219459 A1 * | 9/2008 | Bongiovi et al. | 381/57 |
| 2009/0105858 A1 * | 4/2009 | Bonglovi et al. | 700/94 |
| 2009/0323983 A1 * | 12/2009 | De Muynke et al. | 381/98 |
| 2012/0179456 A1 * | 7/2012 | Ryu et al. | 704/200.1 |

* cited by examiner

Primary Examiner — Fan Tsang
Assistant Examiner — Angelica M McKinney
(74) Attorney, Agent, or Firm — Haverstock & Owens LLP

(57) ABSTRACT

The method comprises the steps of: a) converting the digital audio signal (PCM) into a voltage signal ($V_E$); b) first lowshelf filtering of fixed gain ($G_2$); c) calculating a value of excursion (x) of the loudspeaker; d) comparing the excursion with a maximum value and calculating a first gain of possible attenuation ($G_3$); e) second lowshelf filtering of gain ($G_4+G_3$) taking into account the first gain of possible attenuation; g) comparing with the maximum saturation or clipping voltage ($v_{MAX}$) and calculating a second gain of possible attenuation ($G_5$); h) third lowshelf filtering gain ($G_6+G_3+G_5$) taking into account the first and/or second gains of possible attenuation; i) comparing with the maximum saturation or clipping voltage ($v_{MAX}$) and applying a gain of possible overall attenuation ($G_7$); j) optionally compensating for the nonlinearities of the loudspeaker response; and k) reversely converting the signal ($V_s$) into a digital audio signal (S) without dimension, for later amplification.

7 Claims, 2 Drawing Sheets

METHOD FOR ENHANCING LOW FREQUENCES IN A DIGITAL AUDIO SIGNAL

FIELD OF THE INVENTION

The present invention relates to a technique for low frequency reinforcement in a sound reproduction equipment.

BACKGROUND OF THE INVENTION

The matter is to improve the audio rendering of the lowest frequencies in an equipment comprising an acoustic enclosure provided with an electro-dynamic loudspeaker for the bass, often called a woofer.

Such a loudspeaker produces a sound wave in response to an electrical signal applied as an input, via an electrical/mechanical conversion (by a coil through which an electrical current is circulated and which is plunged in a magnetic field created by polar parts and a magnet) and then a mechanical/acoustical conversion (by displacement of a membrane linked to the coil and that creates the sound wave).

Such loudspeakers are generally installed in open enclosures (ported system) or in closed enclosures, but are always more or less limited in the rendering of the lowest frequencies, the low limit (or cut-off frequency of the enclosure) depending on the loudspeaker size, the enclosure volume and the type of mounting used.

To artificially increase the rendering of the low frequencies and to cornpensate for the attenuation of the lowest frequencies near and below the enclosure cut-off frequency, various methods, often called "bass-boost", have been proposed to artificially increase the rendering of the low frequencies, with accordingly a best rendering of the music for the listener.

The simplest technique consists in increasing the level of the electrical signal in the low frequencies by an appropriate, analog or digital, filtering. The bandwidth is then more extended in the low frequencies than without processing. Such solution has however limitations because the loudspeaker membrane excursion, i.e. the amplitude of its displacement with respect to its equilibrium position, becomes rapidly too high, with a risk of damaging the loudspeaker, and at the very least, a risk of introducing, for excessive excursion values, distortions that rapidly deteriorate the audio signal rendering quality. A second limitation relates to the output electrical power: indeed, the amplifiers that deliver the voltage to the loudspeaker terminals have intrinsic limits. If a bass-boost filter is used, in the low frequencies (where the energy is the highest), the signal will reach more rapidly the limits of the amplifier, with a risk of saturating the latter or outputting a clipped sound.

The EP 2 113 913 A1 (Parrot) proposes a technique based on a psychoacoustic property of the human ear, which makes it possible to perceive low frequencies even if they are not actually reproduced by the loudspeaker. Indeed, the perception of the height of a sound is not only linked to the presence of the fundamental frequency in the signal, by also to that of higher harmonics of this frequency. The technique proposed consists in reinforcing such harmonics, located above the acoustic enclosure cut-off frequency, so as to produce the illusion of a reinforcement of the fundamental frequency, that is not or not much reproduced. Such technique is well appropriate to equipments comprising small-diameter loudspeakers, such as the portable devices or the automotive vehicle equipments. But insofar as it introduces in the sound signal components that was not therein at the origin, it does not suit to the "high fidelity" equipments that, by principle, attempt to reproduce the sound signal in the truest manner possible and with the minimum of alterations.

The US 2008/0175397 A1 describes a system for extending downward the reproduction bandwidth of an acoustic enclosure, dynamically as a function of the power of the signal to be reproduced. The amplification chain comprises a dynamic high-pass filter whose cut-off frequency varies as a function of the power of the input signal (when the signal is stronger, the cut-off frequency is raised to reduce the bass, and vice versa). The sofiltered signal is then applied to a limiter stage whose gain varies dynamically as a function of four parameters calculated in parallel according to linear models, independently from each other: loudspeaker excursion, air speed in the port, detection of an audible saturation of the amplifier, and temperature of the loudspeaker coil. But the fact to use a limiter, which operates on the totality of the signal, has the drawback to introduce nonlinearities and thus to introduce the harmonic distortion. Furthermore, the parallel calculation, independently from each other, of the various factors conditioning the gain of the limiter cannot take into account the interaction between these parameters, nor the nonlinear behavior of a loudspeaker. The EP 1 799 013 A1 proposes a modeling of the loudspeaker behavior, and a compensation for the nonlinearities of the latter, in order to have a system that produces less audio distortions and that provides a better quality of listening by making the loudspeaker membrane displacement the more linear as possible. But it has not for object to dynamically extend the loudspeaker bandwidth in the area of the lowest frequencies, nor to compensate for the physical limitations of the response of the latter in this spectrum area near and below the acoustic cut-off frequency of the loudspecker/enclosure unit.

The US 2005/0207584 A1, U.S. Pat. No. 4,327,250 A and U.S. Pat. No. 6,201,873 B1 describe other techniques than filtering, equalizing or digital processing of the signal, aiming at predicting the loudspeaker response and at limiting if needed the level of the signal to be reproduced, so as to prevent from excessive excursions of the loudspeaker or from distortion-generating nonlinearities. But these other systems also suffer from all or part of the above-mentioned drawbacks.

SUMMARY OF THE INVENTION

The invention has for object a bass-boost technique of low frequency reinforcement that compensates for the limitations of the above-exposed known systems.

The invention aims at proposing a dynamic filtering method, i.e. a method that is modifiable in real time, which increases the signal of the lowest frequencies so as to obtain the flattest possible loudspeaker frequency response (compensating for the attenuation of the loudspeaker/enclosure unit near and below the acoustic cut-off frequency), taking into account, when possible, the mechanical and electrical stresses.

More precisely, the invention aims to operate such a filtering, whose action decreases when the analysis of the signal to be reproduced indicates that the music played risks to cause an excessive displacement of the loudspeaker membrane, or risks to produce a too high voltage on the output stages of the amplifier, with a risk of saturation or clipping of the sound reproduced.

Such a dynamic filtering is notably applicable to an equipment such as that described in the WO 2008/139047 A2 (Parrot), which describes an active acoustic enclosure such as that sold under the appellation Zikmu by Parrot, Paris, France. The enclosure described in this document is an active enclosure with two channels supplied with a digitized audio signal. The bass channel comprises a conventional (i.e. of the piston type) electrodynamic bass loudspeaker or subwoofer for reproducing the lowest frequencies, typically the frequencies lower than 200 Hz. This loudspeaker has its own chain of power stages supplied directly by the corresponding frequency components (lower than 200 Hz) of the digital signal to be reproduced.

The principle of the invention consists in using a chain of filters of the "lowshelf" type, i.e. filters that provide a predetermined, fixed or variable, amplification (x dB/octave), for the frequencies comprised in a range located around a given pivot frequency or "cut-off frequency" $F_0$, and an absence of amplification for the frequencies higher that a limit frequency. Such a lowshelf filter will provide, for example, an amplification of +2 dB (or +4 dB, +8 dB . . . ) at a pivot frequency $F_0$=45 Hz, and no amplification (unit-gain) for the frequencies higher than 100 Hz.

For the implementation of the invention, those filters are digital filters operating on a signal representative of a voltage, after conversion of the digital audio signal (without dimension) as a function of the estimated gain of the power amplifier that will be used downstream.

Essentially, in a first time, the signal is applied to a first lowshelf filter, and a simulation of the loudspeaker membrane displacement is compared with an admissible limit value. In case the value is exceeded, a first set-point attenuation factor is calculated so as not to exceed the fixed threshold. The initial signal is also applied to a second lowshelf filter, whose gain is possibly modulated by the first attenuation factor calculated as a function of the excursion. The resulting signal is applied to a comparator for verifying that the voltage signal that will be delivered by the amplifier will not exceed a given saturation or clipping limit. In case the limit is exceeded, a second set-point attenuation factor is calculated.

The initial signal is also applied to a third lowshelf filter, whose gain is possibly modulated by the first and/or second set-point attenuation factors previously calculated. The resulting signal is applied to an overall-action limiter, comparing the delivered voltage with a threshold and attenuating the signal if this threshold is exceeded.

Such cascade processing (limitation test on the loudspeaker excursion, test on the voltage limitation of the amplifier, before an overall limitation) makes it possible to take into account the interaction between the various parameters. Optionally but advantageously, it also makes it possible to introduce, as will be exposed hereinafter, a nonlinearity compensation processing, even if such processing risks to cause the loudspeaker maximum excursion or the amplifier maximum voltage to be exceeded.

It is therefore possible to simulate an extremely realistic behavior of the loudspeaker/amplifier unit and to avoid any excessive action of low frequency reinforcement that would generate distortion, clipping or saturation phenomena.

More precisely, the invention proposes a method for low frequency reinforcement of the general type known from the above-mentioned US 2008/0175397 A1, i.e. a method that is applicable to a digital audio signal intended to be reproduced by an equipment comprising a loudspeaker having known characteristics of excursion as a function of the signal applied to the terminals thereof, and an amplifier having known characteristics of maximum saturation or clipping voltage.

Characteristically, the method of the invention comprises the successive processing steps of:

a) converting the digital audio signal, initially without dimension, into another digital signal representative of an electrical voltage, as a function of a first predetermined gain of analog amplifier;

b) applying to the signal obtained at step a) a first filtering of the lowshelf type, adapted to amplify selectively, by a second predetermined gain, the frequencies lower than a given pivot frequency;

c) calculating a current value of excursion of the loudspeaker for the signal obtained at step b), as a function of the known characteristics of excursion;

d) comparing the current value of excursion calculated at step c) with a maximum value of excursion, and calculating a third gain of possible attenuation in the case where the current value of excursion exceeds the maximum value of excursion;

e) applying to the signal obtained at step a) a second filtering of lowshelf type, adapted to amplify selectively, by a fourth predetermined gain, not higher than said second predetermined gain and, should the need arise, reduced by the third gain of possible attenuation previously calculated at step d), the frequencies lower than the pivot frequency;

g) comparing the signal obtained at step e) with the maximum saturation or clipping voltage, and calculating a fifth gain of possible attenuation in the case where the amplitude of this signal exceeds a threshold that is a function of the maximum saturation or clipping voltage;

h) applying to the signal obtained at step a) a third filtering of the lowshelf type, adapted to amplify selectively, by a sixth predetermined gain, not higher than said second predetermined gain, and, should the need arise, reduced by the third and fifth gains of possible attenuation previously calculated at steps d) and g), the frequencies lower than the pivot frequency;

k) reversely converting the signal obtained at step h) into a digital audio signal without dimension, as a function of said first predetermined gain of analog amplifier.

Preferably, it is provided, after step h), a step i) of comparing the signal obtained at step h) with said threshold that is a function of the maximum saturation or clipping voltage, and possibly applying a seventh gain of possible overall attenuation to all the frequencies, in the case where the amplitude of this signal exceeds said threshold that is a function of the maximum saturation or clipping voltage.

The method may further comprise, after steps e) and/or h), a step f) (respectively j)) of applying to the signal obtained at step e) (respectively h)) a nonlinearity compensation processing, which is a function of the known characteristics of nonlinearity of the loudspeaker response.

In an advantageous embodiment, the method comprises, after step h), steps of: i) comparing the signal obtained at step h) with said threshold that is a function of the maximum saturation or clipping voltage, and possibly applying a seventh gain of possible overall attenuation to all the frequencies, in the case where the amplitude of this signal exceeds said threshold that is a function of the maximum saturation or clipping voltage; and j) applying to the signal obtained at step i) a nonlinearity compensation processing, which is a function of the known characteristics of nonlinearity of the loudspeaker response, said nonlinearity compensation processing being deactivated in the case where, at step i), the amplitude of the upstream signal exceeds said threshold that is a function of the maximum saturation or clipping voltage.

The method of the invention may be generalized to the case where, besides the excursion, characteristics of the loudspeaker as a function of the signal applied to the terminals thereof are known for at least one additional parameter: step c) further comprises calculating a current value of at least one of said parameters for the signal obtained a step b), as a function of said known characteristics of the additional parameter such as: speed of air in a port of an acoustic enclosure associated with the loudspecker; temperature of the loudspeaker coil; current of the loudspeaker coil; and/or excursion of a passive membrane associated with the loudspeaker. In this case, step d) further comprises comparing the current value of this additional parameter, calculated at step c), with a respective corresponding maximum value, the third gain of possible attenuation being also calculated in case the current value of the additional parameter would exceed the respective corresponding maximum value.

BRIEF DESCRIPTION OF THE DRAWINGS:

An exemplary embodiment of the device of the invention will now be described, with reference to the appended drawings.

DETAILED DESCRIPTION OF THE INVENTION

Figure 1:
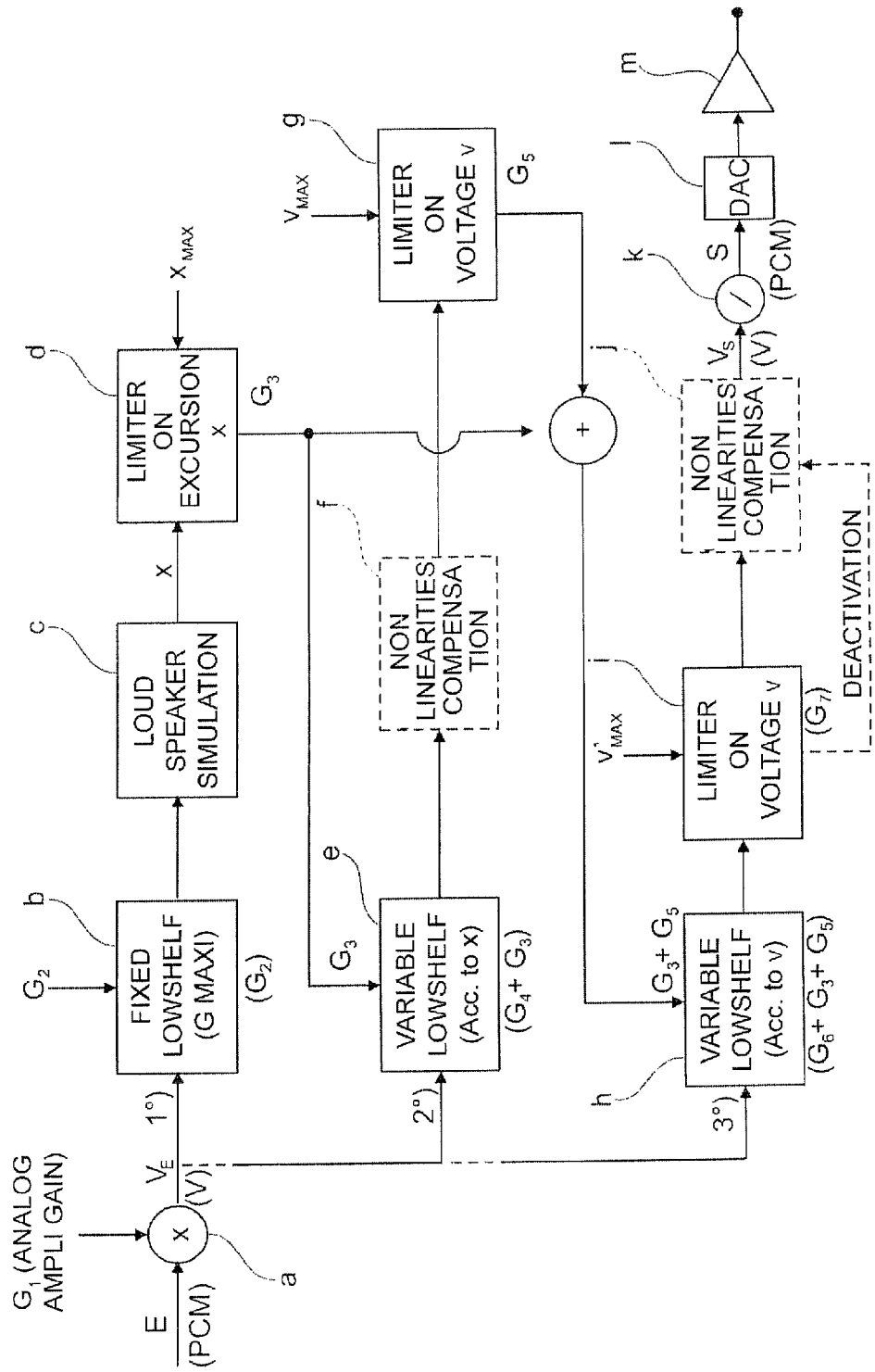
FIG. 1 illustrates, as a block diagram, the processing steps of the method of the invention and the sequence thereof.

FIG. 1 illustrates, as a block diagram, the processing steps of the method of the invention and the sequence thereof.

However, it is to be noted that, although this diagram is shown in the form of interconnected circuits, the implementation of the various functions is essentially software-based, and this representation is only illustrative. The software may notably be implemented within a dedicated chip for digital signal processing of the DSP type.

Insofar as the processing algorithm of the invention simulates the behavior of a loudspeaker or an amplifier, it uses real physical magnitudes (excursions in millimeters, voltage in volts, etc.). Therefore, as the audio signal to be reproduced E, applied as an input, is a signal without dimension (for example, a signal of the PCM type, which is the most common digital audio standard), it is necessary, in a first step denoted a, to convert this signal without dimension E into a voltage magnitude (volts). This conversion is made knowing the gain $G_1$ of the analog amplifier (stage m in the figure) that will be used after the digital processing (stages a to k in the figure), downstream the digital/analog converter (stage l in the figure). $G_1$ corresponds to a conversion factor linked to the peak voltage obtained at the output for a full-scale input signal, with an amplification gain of 0 dB.

The thus-obtained voltage signal $V_E$ is applied as an input to three processing chains corresponding to the stages referred to as b-c-d, e-f-g and respectively, each of these three processing chains comprising at the input thereof a lowshelf-type filter b, e and h, respectively.

Conversely, the final signal issued from the processing steps b to i will be subjected, as will be described in details hereinafter, to a reverse conversion (step k) to obtain an output signal S without dimension (signal PCM), applied to a digital/analog converter (step l) driving an analog power amplifier (schematically represented by stage m).

It will be noted that the processing processes of the three chains b-c-d, e-f-g and h-i-j are executed in cascade, i.e. the result of one of the processing chains serves as an input parameter for the following chain: therefore, the result of the processing processes b-c-d serves as an input parameter for the processing of the chain e-f-g, and the result of the processing processes b-c-d and/or e-f-g serves as an input parameter for the processing chain h-i-j.

In concrete terms, those processing processes are performed by calculation algorithms executed iteratively at the sampling frequency, for all the successive signal frames (for example, 1024 samples).

The way the lowshelf filter, such as that of the stages b, e or h, operates on the signal that is applied to the input thereof will now be explained.

Figure 2:
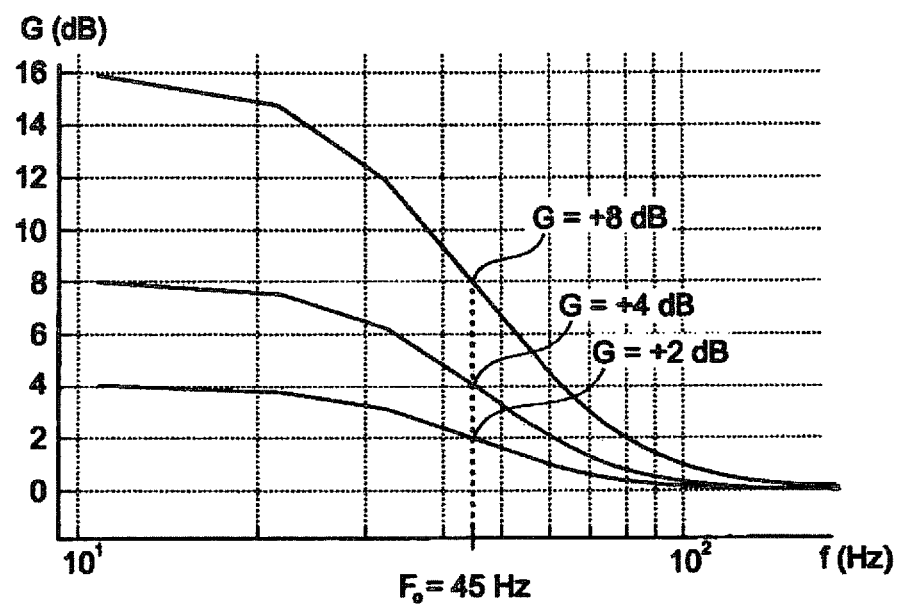
FIG. 2 is an example of frequency response of a lowshelf-type filter used in the processing according to the invention.

Such a second-order lowshelf filter has a characteristic curve such as that illustrated in FIG. 2.

The filtering applied is determined by three parameters: the pivot frequency or "cut-off frequency" $F_0$, the set-point gain G and the quality factor Q. In the example illustrated, the lowshelf filter has a pivot frequency $F_0$ of 45 Hz, which means that the signal will have an amplification at this frequency of G=+2 dB, G=+4 dB, G=+8 dB ... according to the setting of the gain G, with a uniform slope on either side of this frequency. Upwards, the bandwidth of this lowshelf filter is limited to a maximum frequency of 100 Hz, for example, a unit-gain (0 dB) being applied at all the higher frequencies. Downwards, for the lowest frequencies, below a frequency of about 20 Hz in the example illustrated, the amplification gain is made constant, the characteristic curve having substantially a shelf shape.

The lowshelf filters used within the framework of the invention will have constant frequency $F_0$ and quality factor Q, and a variable set-point gain, the maximum gain for the lowest frequencies being able to reach +16 dB at 10 Hz.

Each of the processing steps corresponding to the stages b to m will now be described in details.

The step b corresponds to a lowshelf filter with a fixed gain $G_2$ applied to the voltage signal $V_E$.

This gain $G_2$ is a fixed gain, corresponding to the maximum value of the set-point gain by which the signal will be filtered (for example, G=+8 dB in the example illustrated in FIG. 2). It will be seen hereinafter that the limitations of the system will have for effect that this gain G will be attenuated for the other filters or will be held at this maximum value $G_2$.

The signal issued from the filtering b corresponds to the voltage that would be applied to the terminals of the equipment loudspeaker. The loudspeaker behavior is simulated at step c in such a manner to deliver information x about the mechanical excursion of the membrane as a function of the voltage applied to the coil.

The modeling of the loudspeaker operation has been described by many authors, and will not be described in more details herein. Such modeling describes the electromechanical and mechanical-acoustical behavior of the various elements of the loudspeaker, and makes it possible to know the excursion x of the membrane as well as, if necessary, the intensity i through the coil.

Knowing the excursion x of the membrane makes it possible, at step d, to compare this value with a determined threshold $x_{MAX}$ beyond which the excursion is considered as being too high (risk of damaging the loudspeaker, occurrence of distortions, ... ). If the threshold is exceeded, a set-point attenuation gain $G_3$ is then determined, that is lower that the unit and that would have to be applied in order to reduce the signal in such a manner that the excursion remains in the allowed range.

This first set-point attenuation gain $G_3$ is used as an input parameter of the second processing chain e-f-g.

Therefore, at step e, the voltage signal $V_E$ (i.e. the signal that had been applied as an input of the first lowshelf filter of step b) is filtered again, this time with a lowshelf filter whose gain is variable: this gain is, at a given instant of time, the sum of a fixed gain value $G_4$ (intrinsic gain of the lowshelf e) and of the possible attenuation $G_3$ calculated at step d (attenuation intended to avoid any exceeding of the excursion x of the loudspeaker membrane). The gain $G_4$ is typically equal to $G_2$, and in any case must not be higher than $G_2$.

The processing operated at the following step f on the signal delivered by the second lowshelf filter e is an optional step of compensation for the loudspeaker nonlinearities. Indeed, if the behavior of the loudspeaker has been modeled, the nonlinearities of this behavior can be predicted, and can be compensated for by an appropriate processing applied to the signal. Such a processing is known per se and, for that reason, will not be described in more details herein.

The value of the signal delivered by the lowshelf filter e, possibly compensated for the nonlinearities by the processing of step f, is compared with a value $V_{MAX}$ lower than or equal to, and preferably strictly lower than, the maximum voltage admissible on the amplifier (step g). If the voltage calculated by the processing chain e-f comes to exceed this threshold, then a set-point attenuation gain $G_5$ is calculated, which corresponds to the attenuation that would need to be applied to the input signal to avoid any audio saturation or clipping on the analog amplifier during the amplification of the signal. Such comparison and the calculation of the corresponding gain $G_5$ are performed in the same way as in step d for the maximum excursion $X_{MAX}$ and the calculation of the respective gain $G_3$.

It will be noted that the optional compensation for nonlinearities at step f is operated upstream step g, because the nonlinearity compensation processing generally tends to increase the signal voltage, and must hence be taken into account to verify that the nonlinearity-compensated signal does not exceed the admissible limit $v_{MAX}$.

The two processing chains b-c-d and e-f-g (or e-g) have thus made possible to determine two respective possible set-point attenuation gains $G_3$ and $G_5$ to avoid any exceeding of the excursion x and of the amplification voltage, with respect to the respective admissible maxima.

The thus possibly calculated gains $G_3$ and/or $G_5$ are used as input parameters for the third processing chain h-i-j.

This processing chain comprises a variable lowshelf filtering h receiving as an input the signal $V_E$, i.e. the same signal as that applied to the above-presented filtering stages b and e.

The gain applied to step h is a variable gain, comprising at a given instant of time a fixed gain $G_o$ (intrinsic gain of the lowshelf h), possibly corrected by an attenuation corresponding to the set-point gain $G_3$ or $G_5$, or dually corrected by the cumulated attenuations $G_3+G_5$. Typically, $G_6=G_4=G_2$, and in any case $G_4$ and $G_6$ must not be higher than $G_2$.

The resulting signal is subjected to the following processing (step i) that is operated by a conventional voltage-limiter stage, acting on all the components of the signal (and not only on the bass components as in the case of a lowshelf filtering): if the input voltage exceeds the maximum admissible voltage $v'_{MAX}$ of the amplifier, then an attenuating gain $G_7$ is applied to the signal; in the opposite case, no limitation is applied and the signal is transmitted as such to the downstream stages.

The limitation operated by the stage i is necessary in the case where the voltage exceeding beyond the threshold $v'_{MAX}$ would not be due to the low-frequency signal reinforced by the lowshelf filter h, but for example to a high amplification gain asked by the user of the system, making the audio signal exceed beyond the dynamics accepted by the amplifier.

Downstream the stages h and i, a stage j for nonlinearity compensation, of a type comparable to the above-described stage f, may possibly be provided.

However, it will be noted that, if the signal entering into this stage j has been attenuated by the effect of the limiter of the upstream stage i, then the calculation of the law of control of the nonlinearity compensation is deactivated ant the stage j just transmits the signal without modifying it. Indeed, by nature, the full bandwidth limitation process of the stage i introduces distortions, and it is useless, or even harmful, to try to cancel the distortions of a system in the case of a signal of this type.

It is to be noted that the stage j of nonlinearity compensation is liable to add power to the final voltage signal $V_s$ obtained at the output. Therefore, it is necessary that the limiter stage i preceding this stage j operates relative to a threshold $v'_{MAX}$ taking into account a sufficient margin with respect to the maximum voltage $v_{MAX}$ liable to be delivered by the audio amplifier, if the option of nonlinearity compensation of the stage j is activated.

The voltage signal $V_S$ finally obtained (value in volts) is then subjected to a reverse conversion, at stage k, into an output signal S without dimension, for example of the PCM digital signal type, by dividing the signal $V_S$ by the amplification gain.

The thus-obtained signal may then be reproduced, after digital/analog conversion (stage D and final power amplification (stage m).

Figure 3:
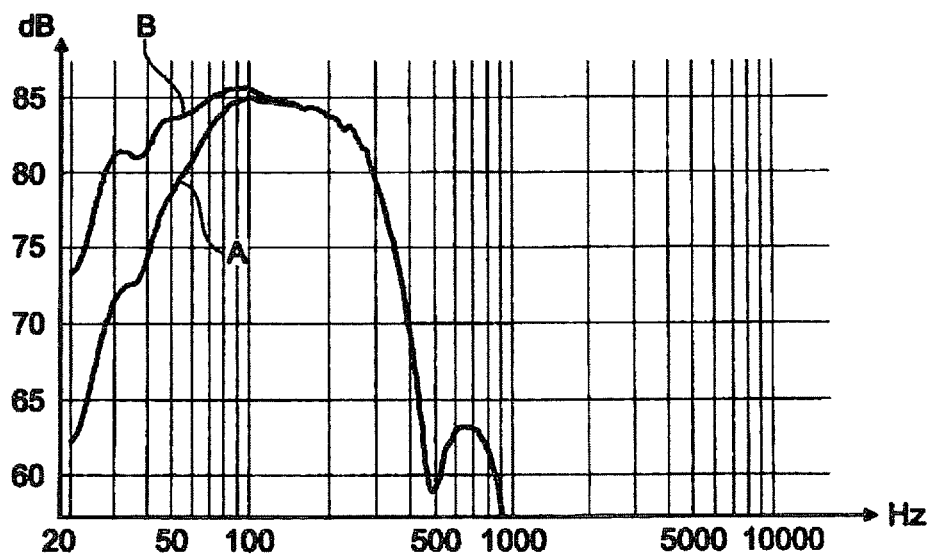
FIG. 3 shows the characteristic curve of frequency response of a bass loudspeaker of the subwoofer type, and the improvement that may be obtained by the reinforcement processing according to the invention.

The obtained result is for example that illustrated in FIG. 3, which shows in A the curve of acoustic response of the loudspeaker/enclosure unit in the absence of a reinforcement processing. The curve B shows the result obtained when applying the processing according to the invention, which provides a gain in the lowest frequencies that can reach +10 dB, without any risk:
- no damaging of the membrane due to an excessive excursion,
- no clipping or saturation of the amplifier because of the increased power rendered in the bass register,
- no introduction of any distortion, and with a possible improvement of the signal, if it is chosen to implement the optional compensation for the nonlinearities of response of the electroacoustic unit.

The invention claimed is:

1. A method for reinforcing the low frequencies in a digital audio signal intended to be reproduced by an equipment comprising a loudspeaker having known characteristics of excursion as a function of the digital audio signal applied to the terminals thereof, and an amplifier having known characteristics of maximum saturation or clipping voltage,
    characterized in that the method comprises the successive processing steps of:
    a) converting the digital audio signal, initially without dimension, into a converted digital signal representative of an electrical voltage with a first predetermined gain of analog amplifier;
    b) applying to the converted digital signal obtained at step a) a first filtering of the lowshelf type, adapted to amplify selectively, by a second predetermined gain, the frequencies lower than a given pivot frequency to form a first filtered signal;
    c) calculating a current value of excursion of the loudspeaker for the first filtered signal obtained at step b), with said known characteristics of excursion;

d) comparing the current value of excursion calculated at step c) with a maximum value of excursion, and calculating a third gain of attenuation when the current value of excursion exceeds the maximum value of excursion;

e) applying to the converted digital signal obtained at step a) a second filtering of lowshelf type, adapted to amplify selectively, by a fourth predetermined gain, not higher than said second predetermined gain and, if the current value of excursion exceeds the maximum value of excursion, reduced by the third gain of attenuation previously calculated at step d), the frequencies lower than the pivot frequency, to form a second filtered signal;

g) comparing the second filtered signal obtained at step e) with the maximum saturation or clipping voltage, and calculating a fifth gain of attenuation when an amplitude of the second filtered signal exceeds a threshold that is a function of the maximum saturation or clipping voltage;

h) applying to the converted digital signal obtained at step a) a third filtering of the lowshelf type, adapted to amplify selectively, by a sixth predetermined gain, not higher than said second predetermined gain and, if the current value of excursion exceeds the maximum value of excursion, reduced by the third and fifth gains of attenuation previously calculated at steps d) and g), the frequencies lower than the pivot frequency, to form a third filtered signal;

k) reversely converting the third filtered signal obtained at step h) into a digital audio signal without dimension, with said first predetermined gain of analog amplifier.

2. The method of claim 1, further comprising, after step h), a step of:
   i) comparing the third filtered signal obtained at step h) with said threshold that is a function of the maximum saturation or clipping voltage, and applying a seventh gain of possible overall attenuation to all the frequencies, when an amplitude of the third filtered signal exceeds said threshold that is a function of the maximum saturation or clipping voltage.

3. The method of claim 1, further comprising, after step e), a step of:
   f) applying to the second filtered signal obtained at step e) a nonlinearity compensation processing, which is a function of the known characteristics of nonlinearity of the loudspeaker response.

4. The method of claim 1, further comprising, after step h), a step of:
   j) applying to the third filtered signal obtained at step h) a nonlinearity compensation processing, which is a function of the known characteristics of nonlinearity of the loudspeaker response.

5. The method of claim 1, further comprising, after step h), steps of:
   i) comparing the third filtered signal obtained at step h) with said threshold that is a function of the maximum saturation or clipping voltage, and applying a seventh gain of overall attenuation to all the frequencies, when the amplitude of the third filtered signal exceeds said threshold that is a function of the maximum saturation or clipping voltage, to form a limited signal; and
   j) applying to the limited signal obtained at step i) a nonlinearity compensation processing, which is a function of the known characteristics of nonlinearity of the loudspeaker response, said nonlinearity compensation processing being deactivated when, at step i), an amplitude of the upstream signal exceeds said threshold that is a function of the maximum saturation or clipping voltage.

6. The method of claim 1, wherein, when the loudspeaker has, besides the excursion, known characteristics of at least one additional parameter as a function of the digital audio signal applied to the terminals of the loudspeaker:
   step c) further comprises calculating a current value of at least one of said parameters for the first filtered signal obtained at step b), as a function of said known characteristics of the additional parameter; and
   step d) further comprises comparing the current value of this additional parameter, calculated at step c), with a respective corresponding maximum value, the third gain of attenuation being also calculated when the current value of the additional parameter would exceed the respective corresponding maximum value.

7. The method of claim 6, wherein said additional parameter is a parameter of the group consisted of: speed of air in a port of an acoustic enclosure associated with the loudspeaker; temperature of the loudspeaker coil; current of the loudspeaker coil; and excursion of a passive membrane associated with the loudspeaker.

* * * * *